(12) United States Patent
Trout (10) Patent No.: US 12,382,614 B2
(45) Date of Patent: Aug. 5, 2025

(54) ELECTRICAL VENTILATOR FOR A TEMPERATURE CONTROL DEVICE OF AN ELECTRONIC COMPUTING DEVICE, ARRANGEMENT AS WELL AS ELECTRONIC COMPUTING DEVICE

(71) Applicant: Connaught Electronics Ltd., Tuam (IE)

(72) Inventor: Shane Trout, Tuam (IE)

(73) Assignee: CONNAUGHT ELECTRONICS Ltd., Tuam (IE)

( * ) Notice: Subject to any disclaimer, the term of this patent is extended or adjusted under 35 U.S.C. 154(b) by 147 days.

(21) Appl. No.: 18/256,751

(22) PCT Filed: Dec. 8, 2021

(86) PCT No.: PCT/EP2021/084680
§ 371 (c)(1),
(2) Date: Jun. 9, 2023

(87) PCT Pub. No.: WO2022/122778
PCT Pub. Date: Jun. 16, 2022

(65) Prior Publication Data
US 2024/0049435 A1 Feb. 8, 2024

(30) Foreign Application Priority Data
Dec. 9, 2020 (DE) .................... 10 2020 132 757.9

(51) Int. Cl.
*H05K 7/20* (2006.01)
(52) U.S. Cl.
CPC ..... *H05K 7/20863* (2013.01); *H05K 7/20172* (2013.01); *H05K 7/2039* (2013.01)

(58) Field of Classification Search
CPC ........... H05K 7/20172; H05K 7/20209; H05K 7/20863; H05K 7/2039; G06F 1/20; G06F 1/183
See application file for complete search history.

(56) References Cited

U.S. PATENT DOCUMENTS 7,855,886 B1 12/2010 Chen et al.
2002/0086574 A1* 7/2002 Vinson ................. H01R 13/745
439/247

(Continued)

FOREIGN PATENT DOCUMENTS

DE 102018207959 A1 12/2018
DE 102018208699 A1 12/2018

(Continued)

OTHER PUBLICATIONS

Electronic device, Zhang et al., CN114025561 (Year: 2022).*

(Continued)

*Primary Examiner* — Michael A Matey
(74) *Attorney, Agent, or Firm* — Osha Bergman Watanabe & Burton LLP (57) ABSTRACT

The invention relates to an electrical ventilator (7) for a temperature control device (16) of an electronic computing device (3), with a housing (10), in which an electrical ventilation device (17) of the electrical ventilator (7) is arranged, and with an electrical contact device (14), which is formed for contacting with a further electrical contact device (15) of the electronic computing device (3), wherein the contact device (14) is formed for transferring at least electrical energy from the electronic computing device (3) to the electrical ventilation device (17), wherein the housing (10) comprises a shaft (18), which is formed for plunging into a recess (19) corresponding thereto on a further housing (9) of the electronic computing device (3) in certain areas, wherein the contact device (14) is fixed in the shaft (18) and (Continued)

is formed for wirelessly and directly contacting with the further contact device (15). Further, the invention relates to an arrangement (21) as well as to an electronic computing device (3).

15 Claims, 5 Drawing Sheets

(56) References Cited

U.S. PATENT DOCUMENTS

| | | | | |
|---|---|---|---|---|
| 2002/0094772 | A1* | 7/2002 | Gough | G06F 1/20 361/695 |
| 2003/0198016 | A1* | 10/2003 | Wobig | H05K 7/20727 257/E23.099 |
| 2004/0091355 | A1* | 5/2004 | Rubenstein | F04D 29/541 415/213.1 |
| 2004/0115986 | A1* | 6/2004 | Chen | F04D 29/601 439/485 |
| 2004/0212960 | A1* | 10/2004 | Shih | H05K 7/20172 361/695 |
| 2006/0203447 | A1* | 9/2006 | Kyle | H05K 7/20172 361/695 |
| 2008/0062642 | A1* | 3/2008 | Figuerado | H05K 7/20727 361/695 |
| 2009/0195979 | A1* | 8/2009 | Ji | H05K 7/20727 361/679.48 |
| 2011/0157817 | A1* | 6/2011 | Li | G06F 1/20 361/679.48 |
| 2011/0255238 | A1* | 10/2011 | Tan | G06F 1/183 361/679.48 |
| 2012/0170218 | A1* | 7/2012 | Wang | H05K 7/20172 361/695 |
| 2013/0064650 | A1* | 3/2013 | Wang | G06F 1/20 415/182.1 |
| 2014/0036440 | A1 | 2/2014 | Inoue et al. | |
| 2016/0041590 | A1* | 2/2016 | Yu | G06F 1/1626 361/679.32 |
| 2019/0116696 | A1* | 4/2019 | Wilcox | H05K 7/20945 |
| 2021/0116978 | A1* | 4/2021 | Yu | H05K 7/20727 |
| 2021/0161031 | A1* | 5/2021 | Wang | H05K 7/20718 |
| 2021/0325851 | A1* | 10/2021 | Lambert | G06F 8/65 |

FOREIGN PATENT DOCUMENTS

| | | |
|---|---|---|
| DE | 102018211086 A1 | 1/2019 |
| DE | 202019102715 U1 | 5/2019 |
| JP | 2016-039234 A | 3/2016 |
| JP | 2017-076716 A | 4/2017 |
| JP | 2019-121519 A | 7/2019 |

OTHER PUBLICATIONS

Waterproof construction of electronic equipment, ITO, JP2008060442 (Year: 2008).*
International Search Report issued in International Application No. PCT/EP2021/084680 mailed on Mar. 31, 2022 (3 pages).
Written Opinion issued in International Application No. PCT/EP2021/084680 mailed on Mar. 31, 2022 (7 pages).
German Search Report issued in German Application No. 10 2020 132 757.9 mailed on Jul. 29, 2021 (11 pages).
Office Action issued in counterpart Japanese Patent Application No. 2023-534989 mailed Sep. 27, 2024 (6 pages).

* cited by examiner

ELECTRICAL VENTILATOR FOR A TEMPERATURE CONTROL DEVICE OF AN ELECTRONIC COMPUTING DEVICE, ARRANGEMENT AS WELL AS ELECTRONIC COMPUTING DEVICE

The invention relates to an electrical ventilator for a temperature control device of an electronic computing device, with a housing, in which an electrical ventilation device of the electrical ventilator is arranged, and with an electrical contact device, which is formed for contacting with a further electrical contact device of the electronic computing device, wherein the contact device is formed for transferring at least electrical energy from the electronic computing device to the electrical ventilation device. Further, the invention relates to an arrangement for an electronic computing device as well as to an electronic computing device.

From the prior art, electrical ventilators are already known, which are formed as a part of a temperature control device for an electronic computing device. In particular in corresponding computing operations of the electronic computing device, for example thermal energy, in particular heat, arises, which has to be dissipated via a corresponding temperature control device to be able to achieve higher power of the electronic computing device. Hereto, it can for example be provided that the temperature control device comprises corresponding cooling fins, which absorb the thermal energy and then emit it to an environment of the electronic computing device. In order to be able to perform improved cooling by means of the temperature control device, an electrical ventilator can be arranged such that it blows air through the cooling fins such that improved heat dissipation of the cooling fins to the environment can be performed via the blown-in air. Thus, more efficient cooling of the electronic computing device can be realized.

It is the object of the present invention to provide an electrical ventilator, an arrangement as well as an electronic computing device, by means of which an assembly reduced in effort can be realized.

This object is solved by an electrical ventilator, an arrangement as well as by an electronic computing device according to the independent claims. Advantageous forms of configuration are specified in the dependent claims.

An aspect of the invention provides an electrical ventilator for a temperature control device of an electronic computing device, with a housing, in which an electrical ventilation device of the electrical ventilator is arranged, and with an electrical contact device, which is formed for contacting with a further electrical contact device of the electronic computing device, wherein the contact device is formed for transferring at least electrical energy from the electronic computing device to the electrical ventilation device.

It is provided that the housing comprises a shaft, which is formed for plunging into a recess corresponding thereto on a further housing of the electronic computing device in certain areas, wherein the contact device is fixed in the shaft and is formed for wirelessly and directly contacting with the further contact device.

Thus, the assembly of the electrical ventilator to the further housing of the electronic computing device can in particular be realized reduced in effort. Thus, directly contacting the electrical ventilator upon attaching the electrical ventilator to the further housing can in particular be realized. By directly contacting, thus, a manual plug connection for contacting the electrical ventilation device with the electronic computing device for example does not have to be plugged, whereby an automated assembly process of the electrical ventilator to the further housing can for example be realized.

In other words, it is provided that upon attaching the electrical ventilator, the shaft plunges into the recess and is there directly contacted with the further contact device already during the plug-in procedure or at least after the plug-in procedure. Thus, an additional, in particular manual, connecting process or plugging process of the contact device on the further contact device does not have to be performed. By plugging the shaft into the recess and the fixed contact device, contacting can already be realized in the plugging process.

In particular, the shaft is hollow-cylindrically formed, wherein the contact device is in turn fixed in the hollow shaft. In other words, the contact device is formed in an internal space of the shaft. In particular, the contact device is fixed, for example screwed, to an inner side of the shaft.

For example, the temperature control device can be provided from a plurality, in particular more than one, of cooling ribs or cooling fins. In particular, it is allowed that the electrical ventilator blows air towards the temperature control device and thus generates an airflow, whereby the air can in turn absorb the heat of the temperature control device and thus can ensure improved cooling of the electronic computing device. For example, improved computing power of the electronic computing device can be achieved by the improved cooling.

The contact device can for example be fixed in the shaft via screws. Further, the contact device can also be fixed in the shaft via corresponding adhesive connections or clamping devices. The contact device can also be injection-molded onto the shaft.

Preferably, the temperature control device is formed for cooling the electronic computing device. However, it can also be provided that heating of the electronic computing device is realized by means of the temperature control device.

According to a further advantageous form of configuration, the electrical ventilation device comprises a first circuit board, on which at least one electrical component for the electrical ventilation device is formed, and the contact device comprises a second circuit board, which is fixed to the shaft. Thus, the contact device is in particular formed on a circuit board, which can also be referred to as Printed Circuit Board (PCB). For example, corresponding contact elements for contacting can be formed on the second circuit board. The second circuit board in turn is in particular fixed in the hollow shaft. Further, the ventilation device comprises a first circuit board, which can for example comprise corresponding circuits for a control of the electrical ventilation device. In particular, the first circuit board is formed in an internal space of the housing and the second circuit board is formed in the internal space of the shaft on the housing.

Further, it has proven advantageous if the first circuit board and the second circuit board are fixed to each other in wired manner. Thus, possible movements between the first circuit board and the second circuit board can in particular be compensated for by the wired connection. The wired connection is in particular a flexible wired connection. For example, if the electronic computing device should be formed in a motor vehicle, thus, impacts during the drive operation of the motor vehicle can be reliably absorbed.

It is further advantageous if the contact device is formed for transferring a control signal from the electronic computing device to the electrical ventilation device in addition to the transfer of the electrical energy. For example, a speed control for the electrical ventilation device, for example a rotational speed, can be transferred as the control signal to the electrical ventilation device. Thus, a control of the electrical ventilation device can in particular be effected via the electronic computing device. Thus, by plugging in the electrical ventilator, contacting both for energy transfer and for transfer of the control signal can be directly performed. Thus, the rotational speed of the electrical ventilation device can for example be adapted in a manner adapted to the computing power of the electronic computing device and to a heat arising from it. Thus, a reliable operation of the electronic computing device can still be realized with little assembly effort of the electrical ventilator to the further housing.

In a further advantageous form of configuration, the contact device comprises at least two contact elements, in particular at least four contact elements, and the further contact device comprises at least two, in particular four, contact elements corresponding to the contact elements. For example, the two contact elements can be formed for transferring electrical energy. Hereto, a first contact element can for example represent a positive electrode and the second contact element can represent the negative electrode. In the form of configuration with four contact elements, it can in particular be provided that at least a third one of the contact elements and a fourth one of the contact elements then serve for transferring a control signal. Thus, both energy and the control signal can be reliably transferred based on direct contact between the contact elements. Thereby, the assembly effort can be enormously reduced since manual arrangement of the electrical ventilator on the further housing with correspondingly manually contacting is in particular no longer required to transfer both electrical energy and the control signal from the electronic computing device to the electrical ventilation device.

Further, it has proven advantageous if at least one of the contact elements of the contact device or of the further contact device is formed as a leaf spring contact element. In particular, the contact elements of the further contact device can then be formed as contact elements corresponding to the leaf spring contact elements. Based on the leaf spring contact elements, it is in particular allowed that contacting between the contact device and the further contact device can be reliably realized upon plugging in. Thus, compensations can in particular also be provided, which are required in arranging the electrical ventilator on the further housing. The leaf spring contact elements are in particular flexible contact elements, which can correspondingly flexibly deform upon application with force such that reliably contacting can be performed.

Further, it has proven advantageous if at least the shaft is substantially rectangularly formed. Thus, the shaft can in particular serve as a guide within the recess. The recess is correspondingly also substantially rectangularly formed corresponding to the shaft. Further, it can for example be ensured that the incorrect arrangement of the electrical ventilator on the further housing is prevented based on the rectangular shape. Hereto, it can for example be provided that a poka-yoke element is additionally formed on the shaft and on the recess such that a reliable plug-in of the shaft into the recess can be realized.

In a further advantageous form of configuration, the housing comprises a ventilation outlet, which is formed substantially orthogonal to the shaft. The ventilation outlet is in particular positioned such that it faces the temperature control device. Thus, the generated airflow can in particular be blown through the ventilation outlet by the electrical ventilator and be guided towards the temperature control device, whereby improved cooling can be realized by means of the temperature control device. Therein, the ventilation outlet is in particular formed orthogonal to the shaft. Thus, the ventilator can in particular be flatly arranged on the further housing and still be reliably contacted with the further contact device and realize improved cooling.

According to a further advantageous form of configuration, the electrical ventilation device is formed as a radial fan. In other words, the electrical ventilation device comprises a kind of air blade wheel, which moves around a rotational axis and thus generates an airflow. By the form of configuration, a very simple and flat electrical ventilator can in particular be provided, which can in particular be simply contacted with the electronic computing device. By means of this form of configuration, installation space can further be saved since the electrical ventilator is very compactly formed. Thus, few signals in particular have to be exchanged between the electronic computing device and the electrical ventilator such that the electrical ventilation device can be controlled in simplified manner. Thus, the assembly of the electrical ventilator to the further housing can be realized reduced in effort.

A further aspect of the invention relates to an arrangement for an electronic computing device with at least an electrical ventilator according to the preceding aspect, and with at least a further housing of the electronic computing device, wherein the electrical ventilator is plunged into a recess on the further housing with a shaft of the electrical ventilator at least in certain areas. In particular, the electrical ventilator and the temperature control device are formed on an outer side of the further housing. In particular, the temperature control device can then absorb thermal energy from the electronic computing device and dissipate it to an environment of the electronic computing device. By means of the electrical ventilator, the thermal energy can then in turn be dissipated into the environment in improved manner by means of the temperature control device based on an airflow generated by the electrical ventilator. By the simple plug-in process of the electrical ventilator on the further housing, a simple assembly can be realized, which can for example also be automatically performed without the intervention of a person.

It is further advantageous if a sealing element for sealing a housing of the electrical ventilator with respect to the further housing of the electronic computing device is formed between the shaft and the recess. Thus, both the ventilator and the electronic computing device can in particular be protected from environmental influences. Thus, a protection from environmental influences can still be reliably realized with a simple assembly. Therein, the sealing element is in particular flexibly and rubber-like formed.

It has further proven advantageous if the housing of the electrical ventilator is fixed to an outer side of the further housing of the electronic computing device by means of at least one screw element. In particular, the electrical ventilator can for example be fixed to the electronic computing device by means of at least two, in particular three, in particular four screw elements. This fixing can also be performed in automated manner such that a complete arrangement and fixing of the electrical ventilator to the further housing can be performed in automated manner. Thus, the arrangement can be produced with less assembly effort. In particular, by fixing by means of the screw element, in particular by means of the at least two screw elements, the contact between the contact devices of the electrical ventilator and the electronic computing device can be reliably retained such that the electrical contact between the contact devices is maintained after arrangement and in particular in for example a drive operation of a motor vehicle, in which the electronic computing device is formed.

In a further advantageous form of configuration, a ventilation outlet of the electrical ventilator faces the temperature control device. Thus, a generated airflow can in particular be blown by the electrical ventilator to the temperature control device via the ventilation outlet, whereby the absorbed heat of the temperature control device can be reliably dissipated into the environment of the electronic computing device. Thus, an improved temperature control of the electronic computing device can be realized.

A still further aspect of the invention relates to an electronic computing device with at least an arrangement according to the preceding aspect and with at least a further circuit board in an internal space of the further housing.

In particular, the further circuit board of the electronic computing device comprises circuits, for example integrated circuits, as well as storage devices and processors, which generate heat in the operation. By means of the arrangement, this generated heat can then in turn be dissipated from the circuit board and the internal space.

According to an advantageous form of configuration of the electronic computing device, the contact device of the electrical ventilator is directly contacted with a further contact device of the electronic computing device, wherein the further contact device is formed directly on the circuit board of the electronic computing device. In particular, the further contact device can for example be directly soldered onto the further circuit board. Thus, the further contact device is fixed to the circuit board. The circuit board itself can in turn for example be fixed within the further housing of the electronic computing device. Thereby, electrically contacting between the electrical ventilator and the further contact device can be realized by simply plugging the shaft into the recess. Thereby, weight and installation space can be saved since a cable connection between the circuit board and the further contact device for example does not have to be formed. Thus, the circuit board further forms a stop for the further contact device and thus also a stop for the contact device and thus also for the electrical ventilator in particular in the contacted state with the contact device.

Advantageous forms of configuration of the electrical ventilator are to be regarded as advantageous forms of configuration of the arrangement and of the electronic computing device.

Further features of the invention are apparent from the claims, the figures, and the description of figures. The features and feature combinations mentioned above in the description as well as the features and feature combinations mentioned below in the description of figures and/or shown in the figures alone are usable not only in the respectively specified combination, but also in other combinations without departing from the scope of the invention. Thus, implementations are also to be considered as encompassed and disclosed by the invention, which are not explicitly shown in the figures and explained, but arise from and can be generated by separated feature combinations from the explained implementations. Implementations and feature combinations are also to be considered as disclosed, which thus do not comprise all of the features of an originally formulated independent claim. Moreover, implementations and feature combinations are to be considered as disclosed, in particular by the implementations set out above, which extend beyond or deviate from the feature combinations set out in the relations of the claims.

Now, the invention is explained in more detail based on preferred embodiments as well as with reference to the attached drawings.

There show.

In the figures, identical or functionally identical elements are provided with the same reference characters.

Figure 1:
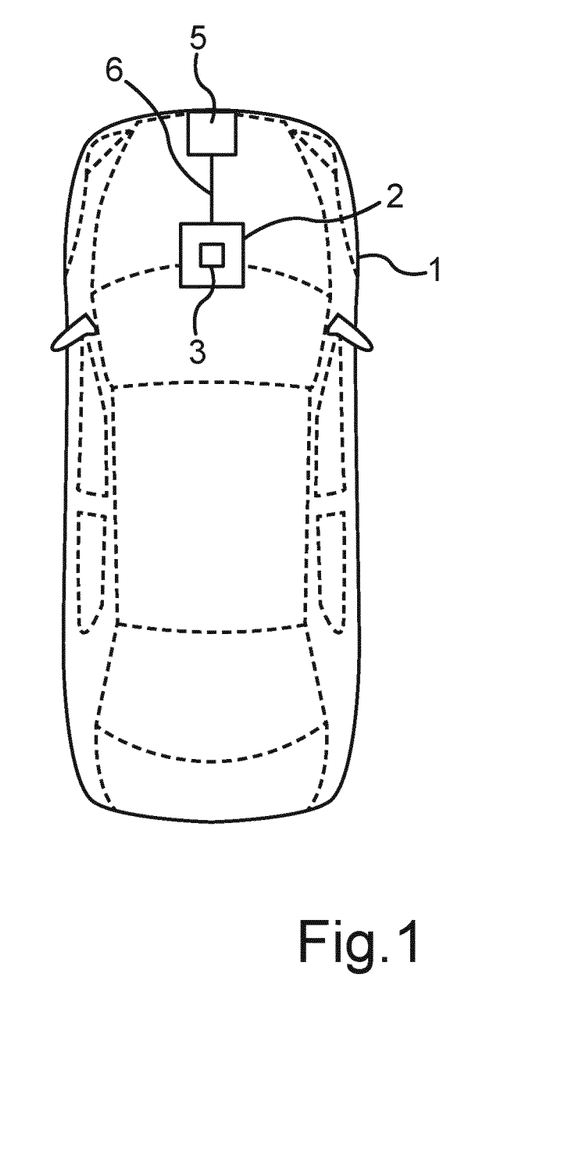
FIG. 1 a schematic top view to an embodiment of a motor vehicle with an embodiment of an electronic computing device.

FIG. 1 shows a schematic top view to an embodiment of a motor vehicle 1. In particular, the motor vehicle 1 comprises an assistance system 2. The assistance system 2 can for example be a parking assistance system, a lane departure warning system or the like. Thus, an at least partially autonomous operation of the motor vehicle 1 can in particular be provided by means of the assistance system 2. The assistance system 2 in turn comprises at least one electronic computing device 3. The electronic computing device 3 can in turn for example capture and process, respectively, information from a capturing device 5 for capturing an environment 4 of the assistance system 2 and perform corresponding evaluations. Hereto, the electronic computing device 3 can in particular comprise a further circuit board 66 (FIG. 2), on which for example integrated circuits and processors are formed, which are formed for performing corresponding evaluating and assessing steps for the assistance system 2. Further, the capturing device 5 can for example be contacted with the electronic computing device 3 via a corresponding cable connection 6.

Figure 2:
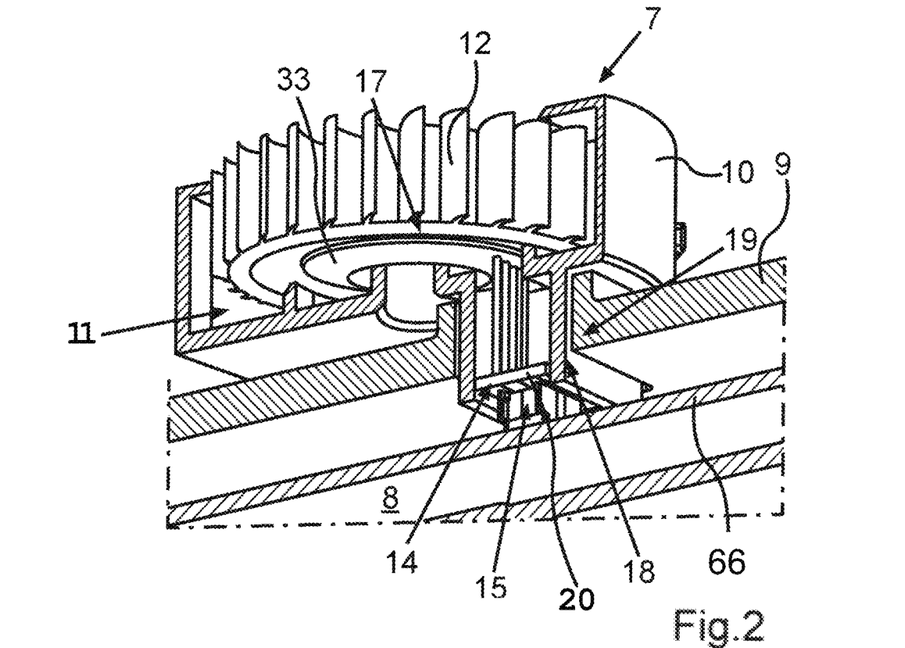
FIG. 2 a schematic perspective view of an embodiment of an electrical ventilator.

FIG. 2 shows a schematic perspective view of an embodiment of the electronic computing device 3 with an embodiment of an electrical ventilator 7. The electronic computing device 3 in particular comprises the further circuit board 66 in an internal space 8 of the electronic computing device 3. The electronic computing device 3 is surrounded by a further housing 9. The electrical ventilator 7 in turn comprises a housing 10. Presently, a radial fan 12 is illustrated in the housing 10, in particular in an internal space 11 of the housing 10. It in particular comprises corresponding fins to generate an airflow 13 (FIG. 3), which is generated for dissipating generated heat by the electronic computing device 3 into the environment 4.

The electrical ventilator 7 comprises a contact device 14. The electronic computing device 3 comprises a further contact device 15.

In particular, the electrical ventilator 7 is formed for a temperature control device 16 (FIG. 3) of the electronic computing device 3. Hereto, the electrical ventilator 7 comprises the housing 10, in which the electrical ventilation device 17 of the electrical ventilator 7 is arranged, and the electrical ventilator 7 comprises the contact device 14, which is formed for contacting with the further contact device 15 of the electronic computing device 3. The contact device 14 is formed for transferring at least electrical energy from the electronic computing device 3 to the electrical ventilation device 17.

Hereto, the housing 10 in particular comprises a shaft 18, which is formed for plunging into a recess 19 corresponding thereto on the further housing 9 of the electronic computing device 3 in certain areas, wherein the contact device 14 is fixed in the shaft 18 and formed for wirelessly and directly contacting with the further contact device 15.

In particular, FIG. 2 shows that the electrical ventilation device 17 can comprise a first circuit board 33, on which at least one electrical component for the electrical ventilation device 17 is formed. For example, corresponding control elements, processors and integrated circuits, for example for a rotational speed control of the radial fan 12, for the electrical ventilation device 17 can be formed on the first circuit board 33. The contact device 14 in particular comprises a second circuit board 20, which is fixed in the shaft 18. In particular, the second circuit board 20 can for example be adhered or screwed to the shaft. Further, the second circuit board 20 can also be injection molded onto the shaft 18. The contact device 14 in particular faces away from a top side of the second circuit board 20 and in particular faces a top side of the further circuit board 66. A bottom side of the second circuit board 20 can face the first circuit board 33.

As shown in FIG. 2, electrically contacting between the contact device 14 and the further contact device 15 is directly performed by plugging the shaft 18 into the recess 19, such that manual connection by for example an assembler does not have to be performed. Thus, plug connections are in particular omitted, which would have to perform an electrical connection between the electrical ventilator 7 and the electronic computing device 3 by hand or in manual manner. Thus, it can for example be provided that an automatic assembly process of the electrical ventilator 7 to the electronic computing device 3 can be performed.

FIG. 2 further shows that at least the shaft 18 is substantially rectangularly formed. In particular, the recess 19 is also rectangularly formed. Thereby, it can be prevented that for example the electrical ventilator 7 is incorrectly arranged on the electronic computing device 3, in particular on the further housing 9. Hereto, it can in particular be further provided that a poka-yoke element is for example formed both on the shaft 18 and on the recess 19 such that a reliable and correct plug-in of the electrical ventilator 7 on the further housing 9 is realized.

Figure 3:
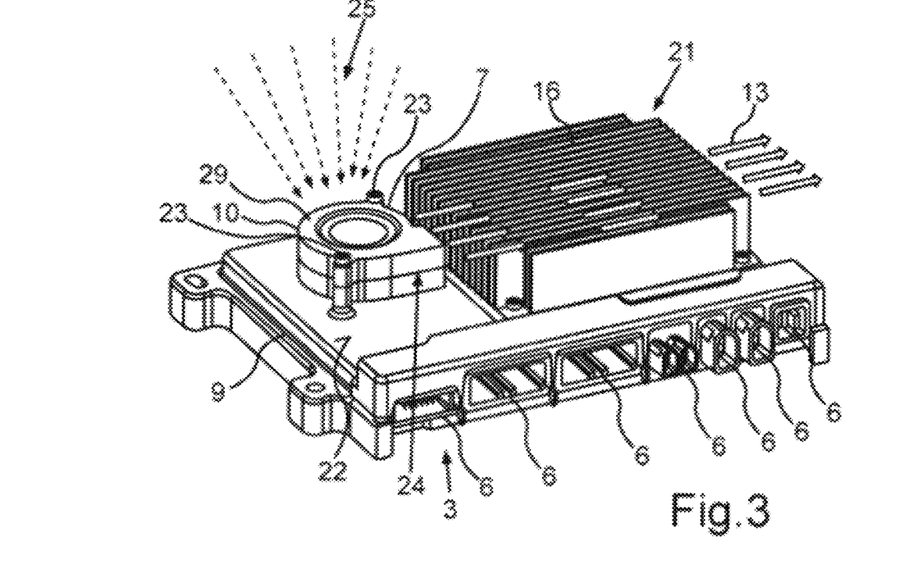
FIG. 3 a schematic perspective view of an embodiment of an electronic computing device.

FIG. 3 shows a schematic perspective view of the electronic computing device 3. Presently, the electronic computing device 3 in particular comprises multiple cable connections 6, by means of which the electronic computing device 3 can for example be contacted with the capturing device 5. Further, the electronic computing device 3 can for example also be connected to a bus system of the motor vehicle 1 via the cable connection 6.

FIG. 3 further shows an embodiment of an arrangement 21. The arrangement 21 is in particular formed for the electronic computing device 3 and comprises at least the electrical ventilator 7 as well as the temperature control device 16. Further, the arrangement 3 comprises at least the further housing 9. Presently, the electrical ventilator 7 is plunged into the recess 19 with the shaft 18. In particular, it is shown that the housing 10 of the electrical ventilator 7 is fixed to an outer side 22 of the further housing 9 of the electronic computing device 3 by means of at least one screw element 23, presently in particular two screw elements 23. Further, FIG. 3 shows that a ventilation outlet 24 of the electrical ventilator 7 faces the temperature control device 16 and in particular can generate the airflow 19. In particular, as presently shown, the electrical ventilator 7 is formed as a radial fan 12. Hereto, air 25 can be sucked, as shown in FIG. 3, and then passed through the temperature control device 16, which presently in particular comprises a plurality of temperature control fins, as the airflow 13.

Figure 4:
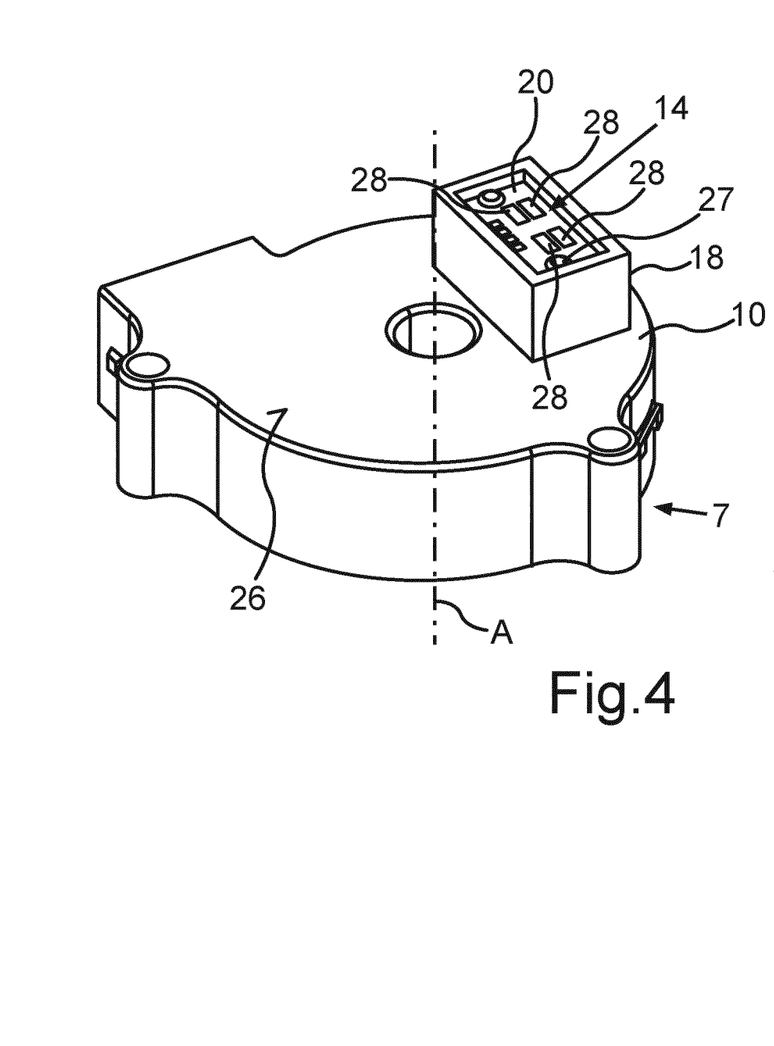
FIG. 4 a further schematic perspective view to a bottom side of an embodiment of the electrical ventilator.

FIG. 4 shows a schematic perspective top view to a bottom side 26 of the electrical ventilator 7. In particular, FIG. 4 shows a view to the bottom side 26 of the housing 10 of the electrical ventilator 7. Presently, an axis A is in particular shown, around which the blade wheel of the radial fan 12 of the electrical ventilator 7 can rotate. Further, FIG. 4 shows the shaft 18 as well as the second circuit board 20, which is presently fixed in the shaft 18 via further screw elements 27. The contact device 14 presently comprises at least two contact elements 28, in particular four contact elements 28. In particular, it can then be provided that the further contact device 15 also comprises at least two contact elements 28, in particular four contact elements 28. A direct contact between the first contact device 14 and the second contact device 15 can be realized via the contact elements 28.

Figure 5:
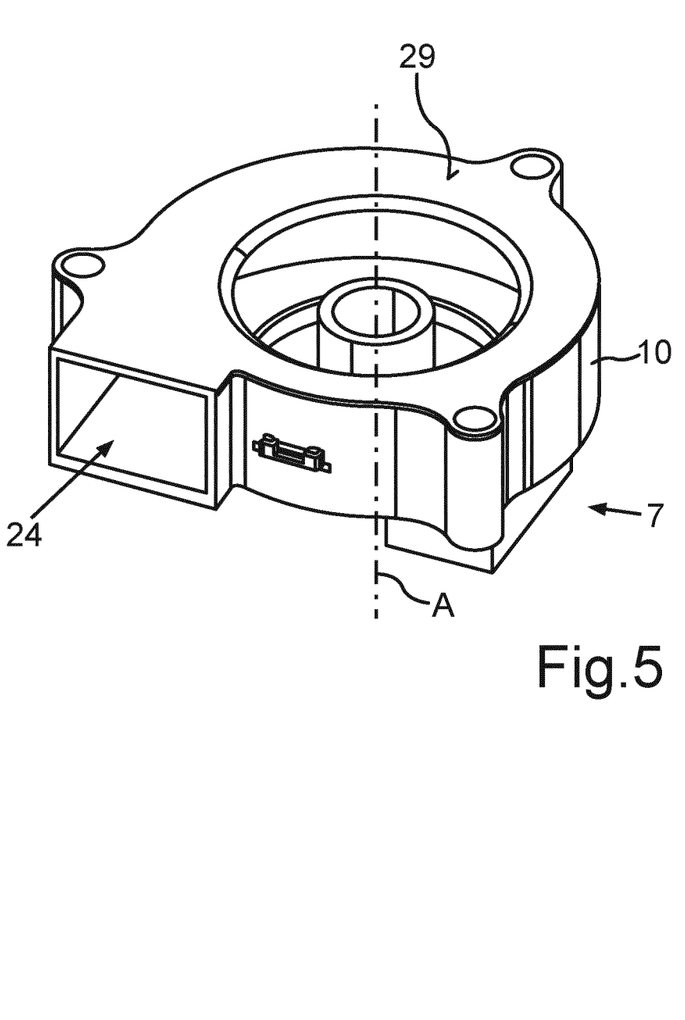
FIG. 5 a further schematic perspective view to a top side of an embodiment of the electrical ventilator.

FIG. 5 shows a further schematic top view to an embodiment of the electrical ventilator 7, in particular to a top side 29 of the electrical ventilator 7 and the housing 10, respectively. In particular, the ventilation outlet 24 is further shown.

Figure 6:
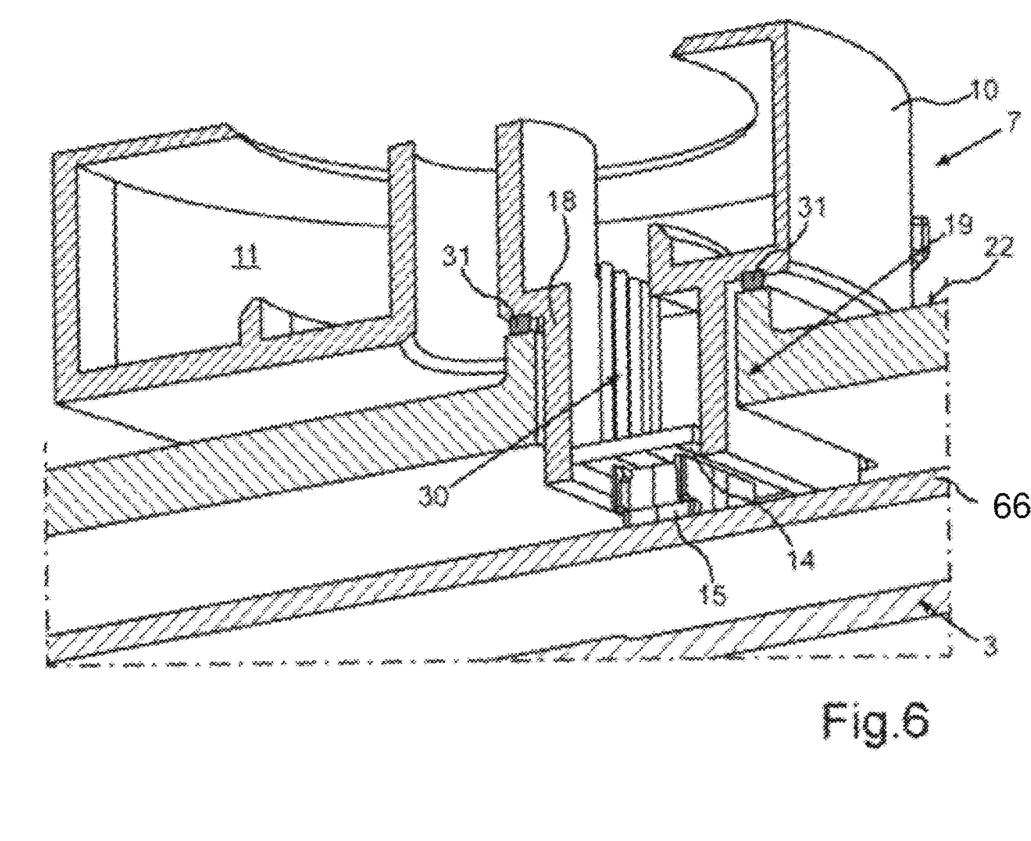
FIG. 6 a schematic sectional view of an embodiment of the electrical ventilator.

FIG. 6 shows a schematic sectional view of an embodiment of the electrical ventilator 7, which is in particular arranged in the recess 19 with the shaft 18. In particular, the shaft 18 presently plunges into the recess 19. The first contact device 14 is contacted with the second contact device 15. The second circuit board 20 can in particular be connected to the first circuit board 19, which is presently not shown, in wired manner via a further cable connection 30. In particular, the further cable connection 30 is a flexible further cable connection 30. Presently the further cable connection 30 in particular comprises four individual wires, wherein two can be formed for the electrical energy transfer and two for the transfer of a control signal. In the present embodiment, it is in particular shown that the housing 10 of the electrical ventilator 7 is sealed on the outer side 22 of the further housing 9 of the electronic computing device 3 by means of at least one sealing element 31. Thus, the sealing element 31 for sealing the housing 10 of the electrical ventilator 7 with respect to the further housing 9 of the electronic computing device 3 is in particular formed between the shaft 18 and the recess 19. Thus, both the electrical ventilator 7 and the electronic computing device 3 can in particular be protected from environmental influences.

Figure 7:
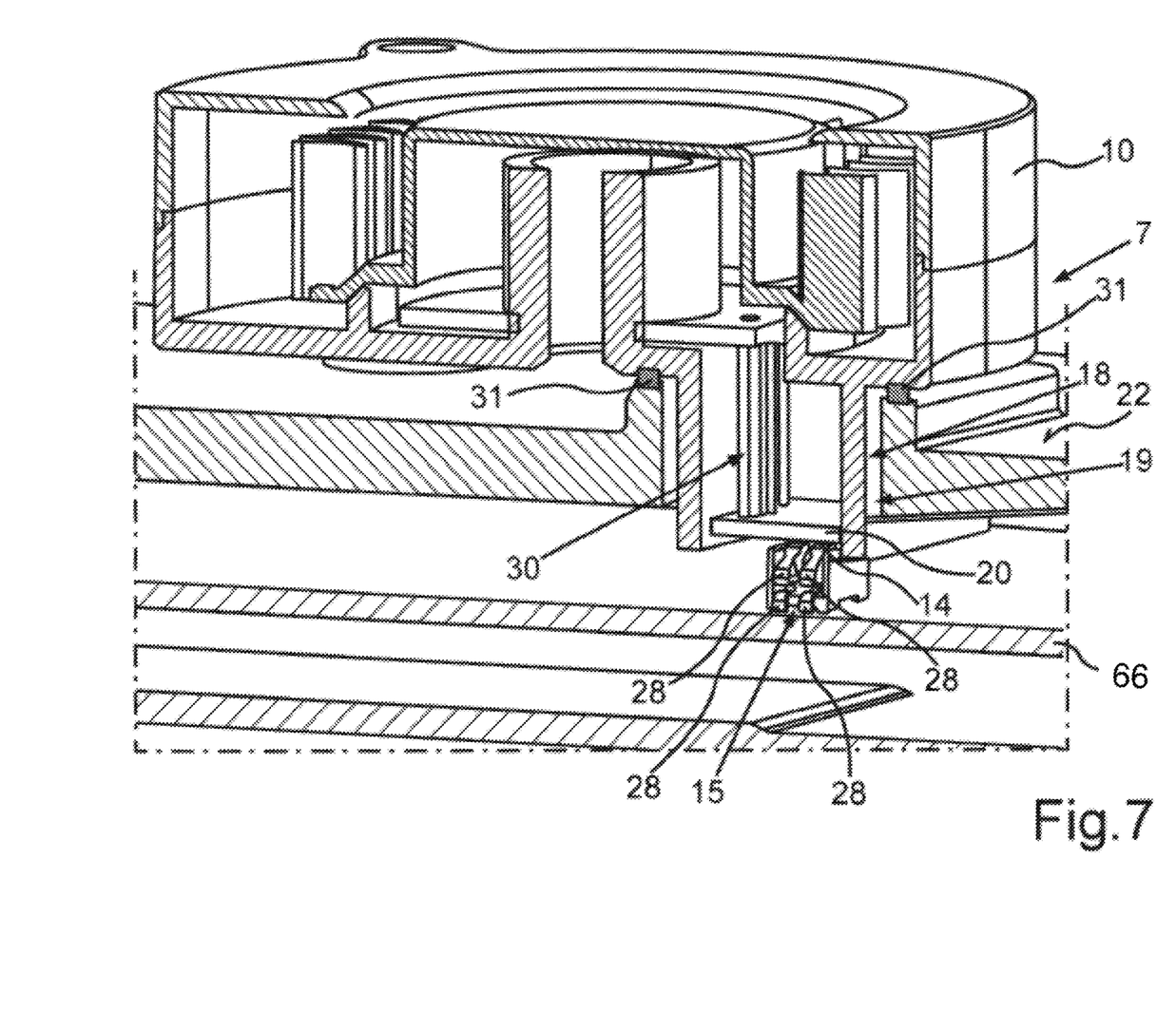
FIG. 7 a schematic perspective sectional view of an embodiment of the electronic computing device.

FIG. 7 shows a further schematic sectional view of an embodiment of the electrical ventilator 7 on the electronic computing device 3. In particular, it is presently shown that the electrical ventilator 7 is arranged in the recess 19 with the shaft 18 and is in particular directly contacted with the further contact device 15 via the contact device 14. Presently, it is in particular shown that the contact device 14 comprises at least two contact elements 28. Presently, the contact elements 28 of the further contact device 15 are in particular formed as leaf spring contact elements 32 such that a reliable contact between the first contact device 14 and the second contact device 15 can be realized. In particular, the contact elements 28 of the contact device 14 can then be formed as contact elements 28 corresponding to the leaf spring contact elements 32. Based on the leaf spring contact elements 32, it is in particular allowed that contacting between the contact device 14 and the further contact device 15 can be reliably realized upon plugging in. Thus, compensations can in particular also be provided, which are required in arranging the electrical ventilator 7 on the further housing 9. The leaf spring contact elements 32 are in particular flexible contact elements 28, which can correspondingly flexibly deform upon application with force such that reliably contacting can be performed.

In particular, it is presently shown that four further cable connections 30 are formed. In particular, the first contact device 14 and the second contact device 15 then presently also comprise four contact elements 28. Thus, electrical energy can in particular be transferred for example via two of the contact elements 28 and it can be provided that a control signal can be transferred from the electronic computing device 3 to the electrical ventilator 7 via the two further contact elements 28. In particular, the control signal can be transferred to the electrical ventilation device 17.

The invention claimed is:

1. An electrical ventilator for a temperature control device of an electronic computing device, the electrical ventilator comprising:
    a housing, in which an electrical ventilation device of the electrical ventilator is arranged; and
    an electrical contact device, which is formed for contacting with a further electrical contact device of the electronic computing device,
    wherein the further electrical contact device is formed for transferring at least electrical energy from the electronic computing device to the electrical ventilation device,
    wherein the housing comprises a shaft integrated into and extending from the housing, which is formed for plunging into a recess corresponding thereto on a further housing of the electronic computing device in certain areas, and
    wherein the electrical contact device is fixed in the shaft and is formed for wirelessly and directly contacting with the further electrical contact device.

2. The electrical ventilator according to claim 1, wherein the electrical ventilation device comprises a first circuit board, on which at least one electrical component for the electrical ventilation device is formed, and the electrical contact device comprises a second circuit board, which is fixed to the shaft.

3. The electrical ventilator according to claim 2, wherein the first circuit board and the second circuit board are connected to each other in wired manner.

4. The electrical ventilator according to claim 1, wherein the further electrical contact device is formed for transferring a control signal from the electronic computing device to the electrical ventilation device in addition to the transfer of the electrical energy.

5. The electrical ventilator according to claim 1, wherein the electrical contact device comprises least four contact elements, and the further electrical contact device comprises at least four, contact elements corresponding to the contact elements.

6. The electrical ventilator according to claim 5, wherein at least one of the contact elements of the electrical contact device is formed as a leaf spring contact element.

7. The electrical ventilator according to claim 1, wherein at least the shaft is substantially rectangularly formed.

8. The electrical ventilator according to claim 1, wherein the housing comprises a ventilation outlet, which is formed substantially orthogonal to the shaft.

9. The electrical ventilator according to claim 1, wherein the electrical ventilation device is formed as a radial fan.

10. An arrangement for the electronic computing device, with at least the electrical ventilator according to claim 1, with the temperature control device and with at least the further housing of the electronic computing device, wherein the electrical ventilator is plunged into the recess on the further housing with the shaft of the electrical ventilator at least in certain areas.

11. The arrangement according to claim 10, wherein a sealing element for sealing a housing of the electrical ventilator with respect to the further housing of the electronic computing device is formed between the shaft and the recess.

12. The arrangement according to claim 10, wherein the housing of the electrical ventilator is fixed to an outer side of the further housing of the electronic computing device by at least one screw element.

13. The arrangement according to claim 10, wherein a ventilation outlet of the electrical ventilator faces the temperature control device which comprises a plurality of temperature control fins.

14. The electronic computing device with at least the arrangement according to claim 10 further comprising: at least a further circuit board in an internal space of the further housing.

15. The electronic computing device according to claim 14, wherein the electrical contact device of the electrical ventilator is directly contacted with the further electrical contact device of the electronic computing device, wherein the further electrical contact device is formed directly on the further circuit board of the electronic computing device.

* * * * *